United States Patent
Huang et al.

(10) Patent No.: US 8,921,174 B2
(45) Date of Patent: Dec. 30, 2014

(54) METHOD FOR FABRICATING COMPLEMENTARY TUNNELING FIELD EFFECT TRANSISTOR BASED ON STANDARD CMOS IC PROCESS

(75) Inventors: Ru Huang, Beijing (CN); Qianqian Huang, Beijing (CN); Zhan Zhan, Beijing (CN); Yingxin Qiu, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 13 days.

(21) Appl. No.: 13/884,095

(22) PCT Filed: Jun. 14, 2012

(86) PCT No.: PCT/CN2012/076879
§ 371 (c)(1),
(2), (4) Date: May 8, 2013

(87) PCT Pub. No.: WO2013/170517
PCT Pub. Date: Nov. 21, 2013

(65) Prior Publication Data
US 2014/0220748 A1     Aug. 7, 2014

(30) Foreign Application Priority Data
May 18, 2012   (CN) .......................... 2012 1 0156899

(51) Int. Cl.
*H01L 21/336*   (2006.01)
*H01L 21/8234*   (2006.01)
(Continued)

(52) U.S. Cl.
CPC .. *H01L 21/823892* (2013.01); *H01L 29/66356* (2013.01); *H01L 29/7391* (2013.01);
(Continued)

(58) Field of Classification Search
USPC ......... 438/197, 199, 194, 208, 289, 414, 510, 438/514, 544, 602, 603, 604, 692, 752, 753, 438/933, 769; 257/E21.006, E21.042, 257/E21.077, E21.051, E21.043, E21.085, 257/E21.126, E21.127, E21.135, E21.142, 257/E21.145, E21.182, E21.267, E21.278, 257/E21.293, E21.304, E21.324, E21.435, 257/E21.632
See application file for complete search history.

(56) References Cited

U.S. PATENT DOCUMENTS 7,560,358 B1 * 7/2009 Kim et al. ..................... 438/424
(Continued)

FOREIGN PATENT DOCUMENTS

| CN | 101771050 A | 7/2010 |
|----|-------------|--------|
| CN | 101777499 A | 7/2010 |

(Continued)

*Primary Examiner* — David Nhu
(74) *Attorney, Agent, or Firm* — Bret E. Field; Bozicevic, Field & Francis LLP

(57) ABSTRACT

Disclosed herein is a method for fabricating a complementary tunneling field effect transistor based on a standard CMOS IC process, which belongs to the field of logic devices and circuits of field effect transistors in ultra large scaled integrated (ULSI) circuits. In the method, an intrinsic channel and body region of a TFET are formed by means of complementary P-well and N-well masks in the standard CMOS IC process to form a well doping, a channel doping and a threshold adjustment by implantation. Further, a bipolar effect in the TFET can be inhibited via a distance between a gate and a drain on a layout so that a complementary TFET is formed. In the method according to the invention, the complementary tunneling field effect transistor (TFET) can be fabricated by virtue of existing processes in the standard CMOS IC process without any additional masks and process steps.

6 Claims, 5 Drawing Sheets

(51) Int. Cl.
*H01L 21/8238* (2006.01)
*H01L 29/66* (2006.01)
*H01L 29/739* (2006.01)

(52) U.S. Cl.
CPC *H01L 21/823807* (2013.01); *H01L 21/823814* (2013.01)
USPC ........... 438/197; 438/199; 438/514; 438/544; 438/663; 257/E21.006; 257/E21.042; 257/E21.043; 257/E21.051; 257/E21.077; 257/E21.085; 257/E21.126; 257/E21.127; 257/E21.135; 257/E21.142; 257/E21.145; 257/E21.182; 257/E21.267; 257/E21.278; 257/E21.293; 257/E21.304; 257/E21.324; 257/E21.435; 257/E21.632

(56) References Cited

U.S. PATENT DOCUMENTS

| | | | |
|---|---|---|---|
| 8,053,785 B2 * | 11/2011 | Cho | 257/77 |
| 8,629,428 B2 * | 1/2014 | Verhulst et al. | 257/27 |
| 8,638,591 B2 * | 1/2014 | Saripalli et al. | 365/154 |
| 8,653,504 B2 * | 2/2014 | Liang et al. | 257/39 |

FOREIGN PATENT DOCUMENTS

| | | |
|---|---|---|
| CN | 101777580 A | 7/2010 |
| CN | 102201450 A | 9/2011 |
| CN | 102364690 A | 2/2012 |

* cited by examiner

METHOD FOR FABRICATING COMPLEMENTARY TUNNELING FIELD EFFECT TRANSISTOR BASED ON STANDARD CMOS IC PROCESS

CROSS-REFERENCE TO RELATED APPLICATION

The present application claims priority to Chinese Patent Application (No. 201210156899.7) filed on May 18, 2012, which is incorporated herein by reference in its entirety as if set forth herein.

FIELD OF THE INVENTION

The present invention refers to logic devices and circuits of field effect transistors in ultra large scaled integrated (ULSI) circuits, and more particularly, refers to a method for fabricating a complementary tunneling field effect transistor (TFET) based on a standard CMOS IC process.

BACKGROUND OF THE INVENTION

As a size of a MOSFET has entered into a nano scale, adverse impacts such as short channel effect of the device and so on are becoming severe, and an off-state leakage current of the device is increasing continuously. At the same time, since a sub-threshold slope of a conventional MOSFET is limited by a thermoelectric potential and thus not decrease synchronously with a shrink of the device, a theoretical limitation of 60 mV/dec is existed. This has caused that a further increasing of leakage current with a drop of a power supply, thus increasing a power consumption of the device. A problem regarding to the power consumption has now become one of the most severe issues restricting scaling-down of the device. In a realm of ultra low voltage and low power consumption, a tunneling field effect transistor (TFET) has become something of a hot topic on the grounds of having a very low leakage current and an ultra steep sub-threshold slope.

Unlike the conventional MOSFET, the TFET has a source and a drain with doping types of opposite to each other, and a channel region and a body region which are both intrinsically doped. The TFET is turned on through by controlling a quantum band-to-band tunneling of a reverse biased P-I-N junction by a gate. The TFET can operate under a lower voltage and has a process compatible with a conventional CMOS process. Practically in a small size standard CMOS IC fabrication process, however, in order to suppress a short channel effect of the MOSFET to prevent a punchthrough, a doping concentration in the body region (a sub surface) of the MOSFET is high while a surface region is lightly doped. However, the concentrations in both of the regions are very high for the TFET. If the TFET is integrated completely based on the standard CMOS IC process, leakage current of the TFET would be increased and there would be an impact to turning-on characteristics of the TFET. In addition, since an obvious bipolar turning-on effect is existed in the TFET, applications of the TFET in integrated circuits are greatly limited. Although the bipolar effect of the TFET may be inhibited in a way of lowering the concentration of the drain to implement a complementary TFET, further photolithographic masks need to be added on a basis of the standard CMOS IC process, which increases process complexity and manufacturing cost.

SUMMARY OF THE INVENTION

An object of the present invention is to provide a method for fabricating a complementary tunneling field effect transistor by making full use of a standard CMOS IC process. By the method according to the present invention, the complementary tunneling field effect transistor (TFET) can be fabricated by virtue of existing processes in the standard CMOS IC process without any additional masks and process steps.

In order to achieve the above-mentioned object, it is provided in the present invention that, an intrinsic channel and body region of the TFET are formed by means of complementary P-well and N-well masks (for performing implantation to form a well doping, channel doping and threshold adjusting) in the standard CMOS IC process. In addition, the bipolar effect in the TFET can be inhibited via a distance between a gate region and a drain region on a layout to form the complementary TFET.

A method for fabricating a complementary tunneling field effect transistor NTFET and PTFET based on a standard CMOS IC process particularly includes the following steps:

(1) Preparing a substrate: a lightly-doped or low concentration-doped P-type semiconductor substrate;

(2) Performing thermal oxidation initially and depositing a nitride layer;

(3) Fabricating an STI isolation for an active region through shallow trench isolation technology, and removing the nitride layer;

(4) Exposing an active region of each of the NTFET and the PTFET simultaneously by photolithography using a P-well mask for an NMOS in a CMOS, and performing P-well implantation, N-channel implantation and N-threshold-adjustment implantation with the NMOS;

(5) Exposing the active region of each of the NTFET and the PTFET simultaneously by photolithography using an N-well mask for a PMOS in a CMOS, and performing N-well implantation, P-channel implantation and P-threshold-adjustment implantation with the PMOS;

(6) Removing an oxide previously grown and growing a gate dielectric layer;

(7) Depositing a material of a gate and then performing photolithography and etching to form a pattern of the gate;

(8) Forming a source of the PTFET and a drain of the NTFET doped consistent with a source and drain of the NMOS through ion implantation using a photoresist and the gate as masks, wherein an implantation concentration is approximately $1 \times 10^{20} \sim 1 \times 10^{21}$ cm$^{-3}$, and a certain interval $L_{ud}$ (depended on a channel length and a doping concentration of device, generally smaller than 100 nm) is existed between an edge of the drain and an edge of the gate of the NTFET;

(9) Forming a source of the NTFET and a drain of the PTFET doped consistent with a source and drain of the PMOS through ion implantation using the photoresist and the gate as masks, wherein an implantation concentration is approximately $1 \times 10^{20} \sim 1 \times 10^{21}$ cm$^{-3}$, and a certain interval $L_{ud}$ (depended on a channel length and a doping concentration of device, generally smaller than 100 nm) is existed between an edge of the drain and an edge of the gate of the PTFET;

(10) Performing a rapid high-temperature annealing to activate impurities; and

(11) Finally performing subsequent processes consistent with the CMOS, including depositing a passivation layer, opening a contact hole and metallization and so on, so that the complementary tunneling field effect transistor is fabricated.

In the above method, in step (1), the semiconductor substrate is selected from Si, Ge, SiGe, GaAs or other binary or ternary compound semiconductor of group II-VI, III-V and IV-IV, silicon-on-insulator (SOI) or germanium-on-insulator (GOI).

In the above method, in step (6), a material of the gate dielectric layer is selected from $SiO_2$, $Si_3N_4$, or high-K gate dielectric material.

In the above method, in step (6), a method of growing the gate dielectric layer is selected from one of the following methods: regular thermal oxidation, nitrating thermal oxidation, chemical vapor deposition and physical vapor deposition.

In the above method, in step (7), the material of the gate is selected from a doped polysilicon, metal cobalt, nickel or other metal or metal silicide.

In the method for fabricating a complementary tunneling field effect transistor based on a standard CMOS IC process according to the invention, since in the standard CMOS process, threshold voltages of an NMOS and a PMOS after a threshold adjustment implantation are generally complementary with each other, doping types at the channels of the NMOS and the PMOS are opposite to each other while doping concentrations are approximately the same. In this regard, by using masks for wells of the NMOS and the PMOS at the same time in the TFET process and doping two types of impurities for adjusting MOS threshold, the doped impurities are compensated with each other so that a channel having an intrinsic-like doping effect is formed and thus the TFET is formed. In addition, in performing photolithography for the drain region of the TFET, the bipolar effect of the TFET can be effectively inhibited by leaving a certain interval $L_{ud}$ between the drain and the gate, so that the complementary TFET is fabricated.

The complementary tunneling field effect transistor according to the present invention has a simple fabrication process and has a method fully based on a standard CMOS IC process. The complementary TFET can be effectively integrated in CMOS integrated circuits without any additional process steps and masks. Further, integrated circuits composed of the TFET with low power consumption may be fabricated through the standard process, which would greatly reduce production cost and simplify process flow.

1- semiconductor substrate   2- dielectric layer
3- STI isolation   4- P-well
5- N-channel implantation   6- N-threshold-adjustment implantation
7- photoresist   8- equivalent intrinsic doping after doping compensation
9- gate   10- highly-doped source region
11- highly-doped drain region   12- passivation layer in a subsequent process
13- metal layer in a subsequent process

DETAILED DESCRIPTION OF THE EMBODIMENTS

A further description of the invention will be illustrated through examples. It is noted that embodiments disclosed herein are provided to help to understand the present invention. Those skilled in the art are appreciated that substitutions and modifications are possible without departing from the scope and spirit of the present invention as defined by the invention and the appended claims. Therefore, the present invention is not limited to the contents disclosed by the embodiments. The scope to be protected by the present invention is defined by the scope of the claims.

An example of a fabrication method according to an embodiment of the invention includes process steps shown in FIG. 2 to FIG. 9.

Figure 1:
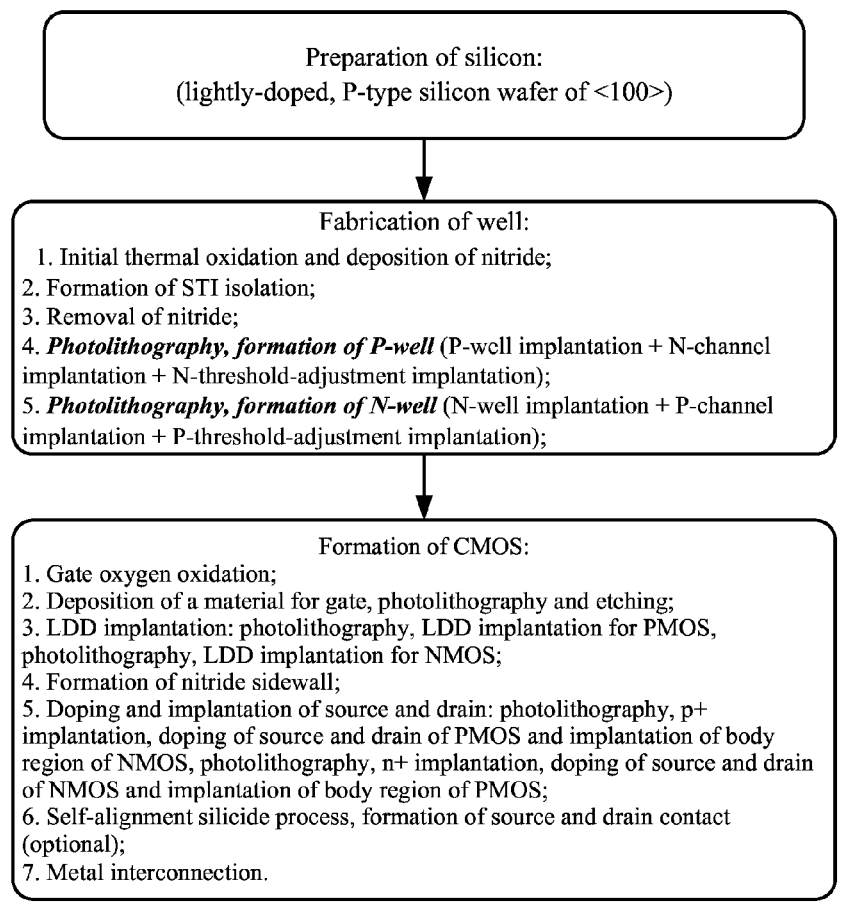
FIG. 1 is a flow chart showing a typical standard silicon-based-and-double-well CMOS IC process.
Figure 2:
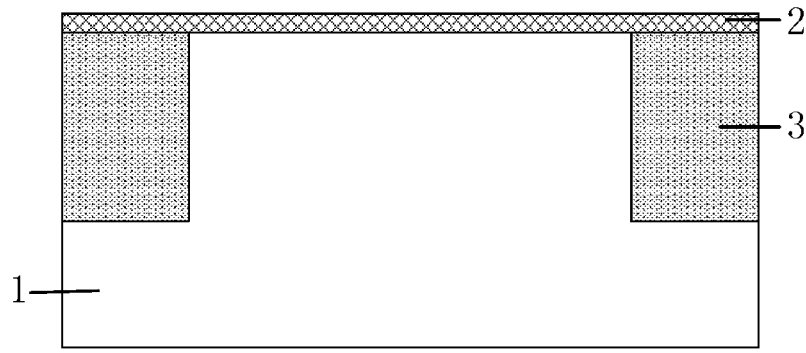
FIG. 2 is a cross-section view of a TFET in which a nitride layer is removed after an STI isolation is formed on a semiconductor substrate.

1. As shown in FIG. 2, a silicon dioxide layer with a thickness of approximately 10 nm is initially formed by thermal oxidation on a bulk-silicon substrate 1 which has a lightly-doped concentration and has a crystal orientation of <100>. Further, a silicon nitride layer with a thickness of approximately 100 nm is deposited. Next, an etching process for STI is performed, an isolation material is deposited to fill a deep hole, and then a CMP process is performed. Thus, an STI isolation 3 for an active region is fabricated through a shallow trench isolation technology. Subsequently, the silicon nitride layer is removed by wet erosion.

Figure 3:
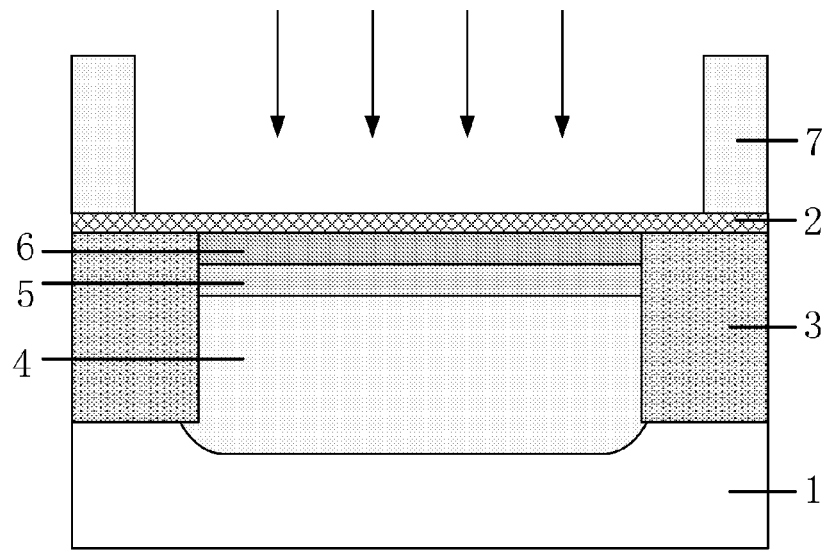
FIG. 3 is a cross-section view of the TEFT in which an active region of the TFET is exposed through photolithography using a P-well mask for a CMOS, and P-well implantation, N-channel implantation and N-threshold-adjustment implantation are performed.

2. As shown in FIG. 3, an active region of each of an NTFET and a PTFET are exposed through photolithography using a P-well mask for an NMOS in a CMOS. P-well implantation 4, N-channel implantation 5 and N-threshold-adjustment implantation 6 are performed with the NMOS. Implanted impurities are $BF_2^+$, with an energy and a dose of 200 keV 2e13, 80 keV 1e13, and 25 KeV 2e12, respectively.

Figure 4:
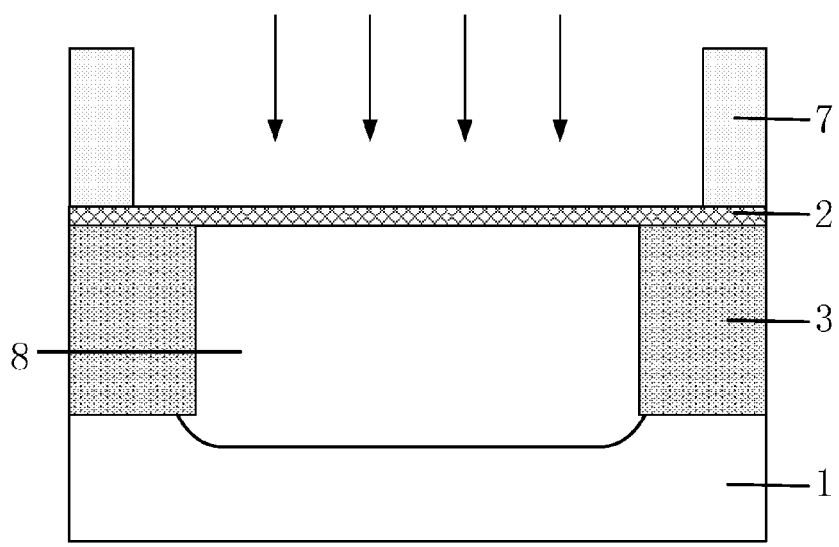
FIG. 4 is a cross-section view of the TEFT in which on a basis of the above implantations in FIG. 3 the active region of the TFET is exposed through photolithography using an N-well mask for the CMOS, and N-well implantation, P-channel implantation and P-threshold adjustment implantation are performed.

3. As shown in FIG. 4, the active region of each of the NTFET and the PTFET are exposed through photolithography using an N-well mask for a PMOS in the CMOS. N-well implantation, P-channel implantation and P-threshold-adjustment implantation are performed with the PMOS. Implanted impurities are $P^+$, with the same implantation concentration as the $BF_2^+$ implanted as above. Since the impurities are fully compensated with each other, an intrinsic-like doping 8 is formed in a channel region and a body region of the TEFT.

Figure 5:
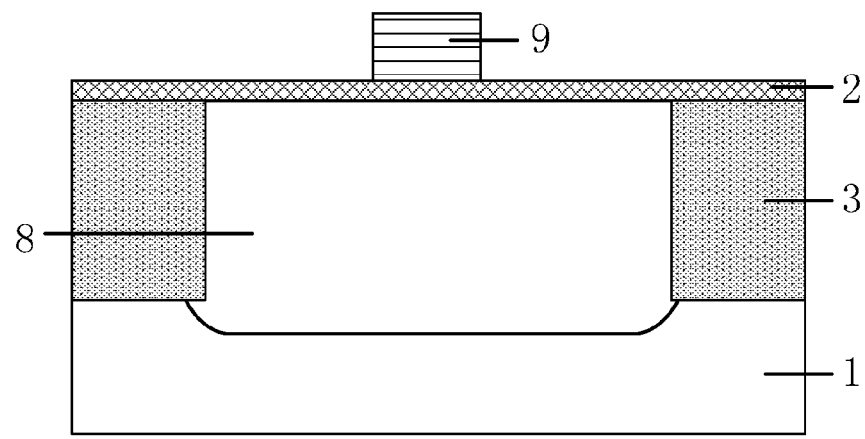
FIG. 5 is a cross-section view of the TEFT in which a gate is formed by photolithography and etching.

4. The initially-grown silicon dioxide layer is rinsed off, and a gate dielectric layer 2 is formed through thermal growth. The gate dielectric layer is $SiO_2$, with a thickness of 1~5 nm. A material for a gate 9 is deposited, in which the material for the gate is a doped polysilicon layer with a thickness of 150~300 nm. A pattern of the gate is formed by photolithography. The material for the gate 9 is etched up to the gate dielectric layer 2, as shown in FIG. 5.

Figure 6:
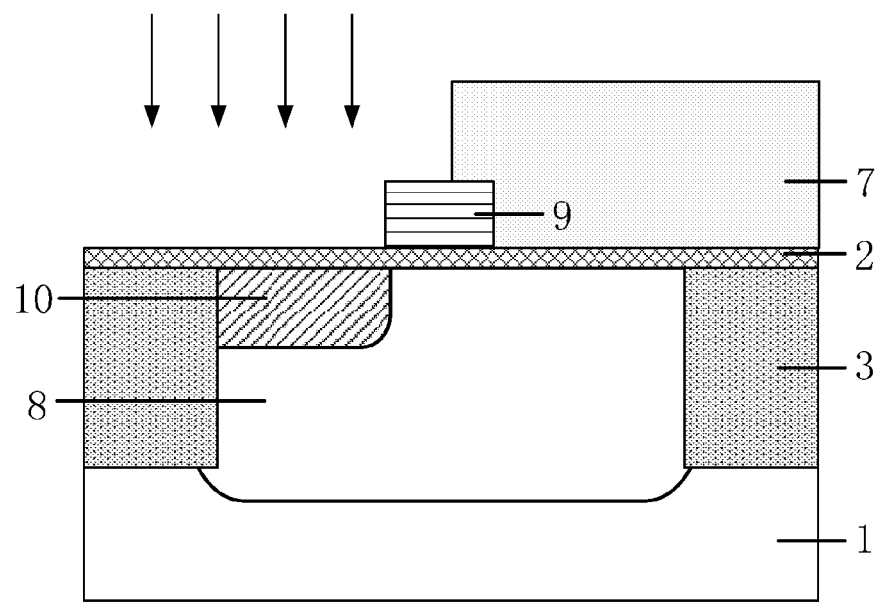
FIG. 6 is a cross-section view of the TEFT in which a source region of the TFET is exposed through photolithography and is performed ion implantation to form a source region with high doping concentration.

5. A source 10 of the PTFET and a drain of the NTFET are ion implanted using a photoresist 7 and the gate 9 as masks, with an implantation concentration which is the same as an implantation concentration for a source and drain in the NMOS an ion implantation energy of 50 keV, a dose of 1e15, and implanted impurities of $As^+$. There is a certain interval $L_{ud}$ of 50 nm between an edge of the drain and an edge of the gate of the NTFET. FIG. 6 shows the PTFET.

Figure 7:
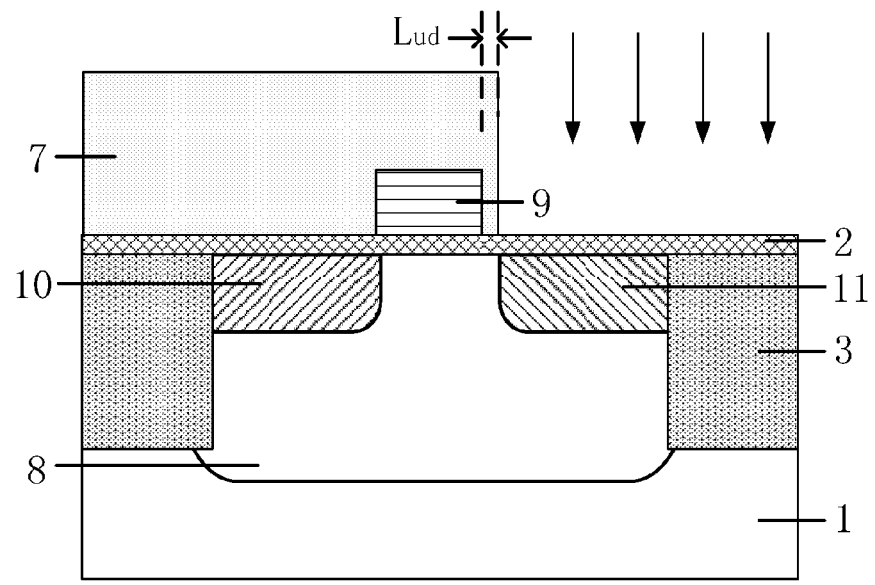
FIG. 7 is a cross-section view of the TEFT in which a drain region of the TFET is exposed through photolithography and is performed ion implantation to form a highly-doped drain region of an opposite doping type, and an interval $L_{ud}$ is existed between the drain region and the gate.

6. A source of the NTFET and a drain 11 of the PTFET are ion implanted using the photoresist 7 and the gate 9 as masks with an implantation concentration which is the same as an implantation concentration for a source and a drain in the PMOS, an ion implantation energy of 40 keV, a dose of 1e15, and implanted impurities of $BF_2^+$. There is a certain interval $L_{ud}$ of 50 nm between an edge of the drain and an edge of the gate of the PTFET. FIG. 7 shows the PTFET.

7. A rapid high-temperature annealing is performed one time, so that the impurities doped in the source and the drain are activated.

Figure 8:
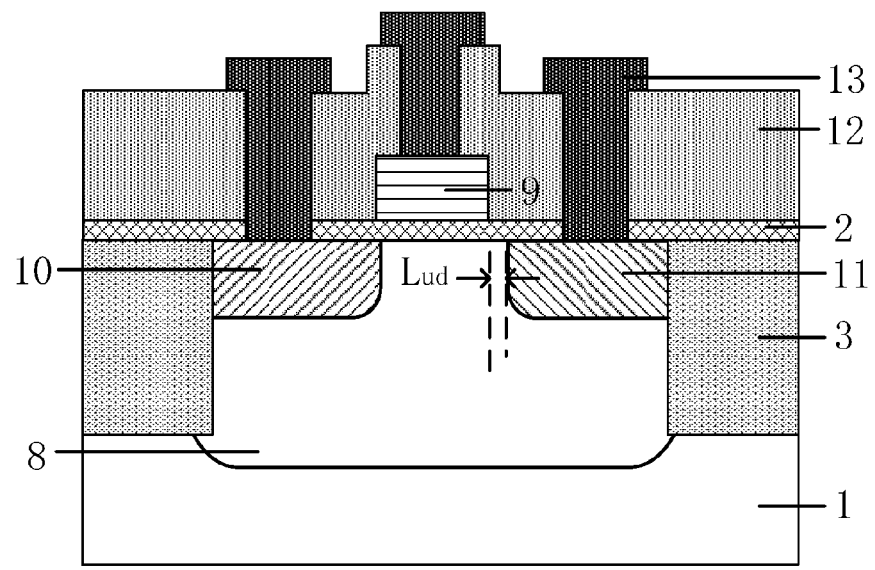
FIG. 8 is a cross-section view of the TEFT in which subsequent processes (forming a contact hole, and metallization) are performed.
Figure 9:
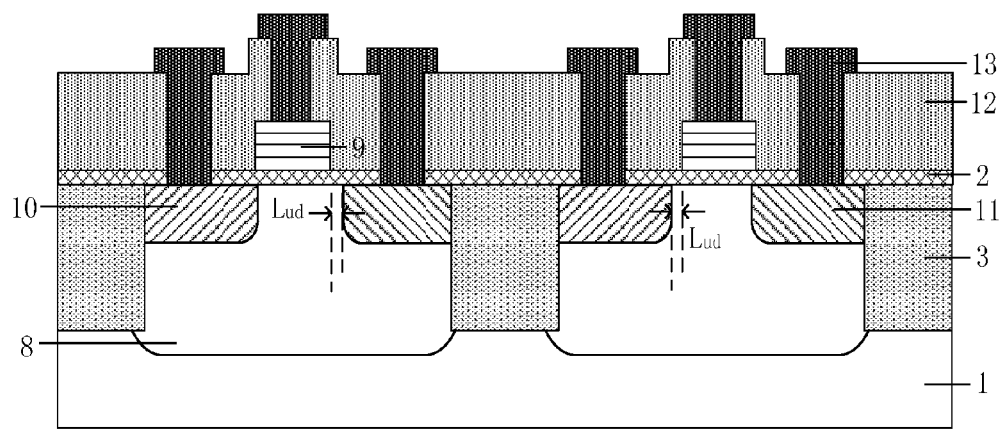
FIG. 9 is a cross-section view of a complementary tunneling field effect transistor of the present invention.

8. Finally, subsequent processes including depositing a passivation layer 12, opening a contact hole, and metalizing 13 and so on in the typical CMOS are performed. FIG. 8 shows a P-type tunneling field effect transistor fabricated based on the standard CMOS IC process. FIG. 9 shows the complementary tunneling field effect transistor fabricated based on the standard CMOS IC process. The PTFET and the NTFET are shown from left to right.

Although the present invention has been illustrated with reference to preferred embodiments mentioned above, it is not intended to limit the present invention to those embodiments. Various changes, modifications or equivalents of the embodiments to the technical solution of the present invention can be made by those skilled in the art by using the above-disclosed methods and techniques without departing from the scope of the technical solution of the invention. Thus, it is intended that the present invention covers all such changes, modifications or equivalents of the embodiments without departing from the content of the technical solution of the present invention they come within the scope to be protected by the technical solution of the present invention.

What is claimed is:

1. A method for fabricating a complementary tunneling field effect transistor NTFET and PTFET based on a standard CMOS IC process, comprising:
   (1) Preparing a substrate: a lightly-doped or low concentration-doped P-type semiconductor substrate;
   (2) Performing thermal oxidation initially and depositing a nitride layer;
   (3) Fabricating an STI isolation for an active region through shallow trench isolation technology, and removing the nitride layer;
   (4) Exposing an active region of each of an NTFET and a PTFET simultaneously by photolithography using a P-well mask for an NMOS in a CMOS, and performing P-well implantation, N-channel implantation and N-threshold-adjustment implantation with the NMOS;
   (5) Exposing the active region of each of the NTFET and the PTFET simultaneously by photolithography using a N-well mask for an PMOS in the CMOS, and performing N-well implantation, P-channel implantation and P-threshold-adjustment implantation with the PMOS;
   (6) Removing an oxide previously grown and growing a gate dielectric layer;
   (7) Depositing a material for a gate and then performing photolithography and etching to form a pattern of the gate;
   (8) Forming a source of the PTFET and a drain of the NTFET doped consistent with a source and drain of the NMOS through ion implantation using a photoresist and the gate as masks, with an implantation concentration of $1 \times 10^{20} \sim 1 \times 10^{21}$ cm$^{-3}$, and a certain interval $L_{ud}$ is existed between an edge of the drain and an edge of the gate of the NTFET;
   (9) Forming a source of the NTFET and a drain of the PTFET doped consistent with a source and drain of the PMOS through ion implantation using the photoresist and the gate as masks, with an implantation concentration of $1 \times 10^{20} \sim 1 \times 10^{21}$ cm$^{-3}$, and a certain interval $L_{ud}$ is existed between an edge of the drain and an edge of the gate of the PTFET;
   (10) Performing a rapid high-temperature annealing to activate impurities; and
   (11) Performing subsequent processes such as depositing a passivation layer, opening a contact hole and metallization, so that the complementary tunneling field effect transistor NTFET and PTFET is fabricated.

2. The method for fabricating a complementary tunneling field effect transistor NTFET and PTFET according to claim 1, characterized in that, in step (1) a material of the semiconductor substrate is selected from Si, Ge, SiGe, GaAs or other binary or ternary compound semiconductor of group II-VI, III-V and IV-IV, silicon-on-insulator or germanium-on-insulator.

3. The method for fabricating a complementary tunneling field effect transistor NTFET and PTFET according to claim 1, characterized in that, in step (6) a material of the gate dielectric layer is selected from $SiO_2$, $Si_3N_4$, high-K gate dielectric material.

4. The method for fabricating a complementary tunneling field effect transistor NTFET and PTFET according to claim 3, characterized in that, in step (6) a method of growing the gate dielectric layer is selected from one of the following methods:
   regular thermal oxidation, nitrating thermal oxidation, chemical vapor deposition and physical vapor deposition.

5. The method for fabricating a complementary tunneling field effect transistor NTFET and PTFET according to claim 1, characterized in that, in step (7) the material of the gate is selected from a doped polysilicon, metal cobalt, nickel and other metal or metal silicide.

6. The method for fabricating a complementary tunneling field effect transistor NTFET and PTFET according to claim 1, characterized in that, the interval $L_{ud}$ between the edge of the drain and the edge of the gate is smaller than 100 nm.

* * * * *